US011689226B2

(12) United States Patent
Beamish et al.

(10) Patent No.: US 11,689,226 B2
(45) Date of Patent: Jun. 27, 2023

(54) METHODS AND APPARATUS FOR TRANSMITTING SIGNALS

(71) Applicant: u-blox AG, Thalwil (CH)

(72) Inventors: Norman Beamish, Cork (IE); Robert Ronan, Cork (IE); Graham Smith, Cambourne (GB)

(73) Assignee: u-blox AG, Thalwil (CH)

( * ) Notice: Subject to any disclaimer, the term of this patent is extended or adjusted under 35 U.S.C. 154(b) by 188 days.

(21) Appl. No.: 17/206,640

(22) Filed: Mar. 19, 2021

(65) Prior Publication Data

US 2022/0302934 A1 Sep. 22, 2022

(51) Int. Cl.
*H04B 1/04* (2006.01)
*H03D 7/16* (2006.01)
*H04W 72/0453* (2023.01)

(52) U.S. Cl.
CPC .............. *H04B 1/04* (2013.01); *H03D 7/161* (2013.01); *H04W 72/0453* (2013.01)

(58) Field of Classification Search
CPC ........ H04B 1/04; H04B 1/0475; H04B 17/10; H04B 1/16; H04B 2001/0416; H04B 17/336; H04B 2001/0408; H04B 2001/0491; H04B 15/00; H04B 7/06; H03D 7/161; H04W 72/0453; H04W 52/52

See application file for complete search history.

(56) References Cited

U.S. PATENT DOCUMENTS

| | | | | |
|---|---|---|---|---|
| 6,091,939 A | * | 7/2000 | Banh ...................... | H03D 7/161 375/261 |
| 7,016,662 B1 | * | 3/2006 | Manku .................... | H04B 1/30 455/314 |
| 2007/0165743 A1 | * | 7/2007 | McCallister .......... | H03F 1/3247 375/296 |
| 2008/0144707 A1 | * | 6/2008 | Tsfati .................... | H04B 17/13 455/127.2 |
| 2009/0239489 A1 | | 9/2009 | Kaczman et al. | |
| 2014/0191815 A1 | * | 7/2014 | Mirzaei .................. | H03L 7/099 331/1 A |
| 2016/0173143 A1 | * | 6/2016 | Hwang ................. | H04B 1/0475 375/267 |
| 2018/0241379 A1 | * | 8/2018 | Murphy ........ | H04B 2001/0408 |
| 2018/0248572 A1 | * | 8/2018 | Ishikawa .............. | H04B 1/0475 |
| 2019/0379327 A1 | * | 12/2019 | Mattisson ................ | H03D 1/04 |

* cited by examiner

*Primary Examiner* — Lana N Le
(74) *Attorney, Agent, or Firm* — Finnegan, Henderson, Farabow, Garrett & Dunner, L.L.P.

(57) ABSTRACT

Methods and apparatus for transmitting signals, the transmitter including a memory storing instructions and a controller configured to execute the instructions to cause the transmitter to determine whether a value of transmitter power is less than a threshold, responsive to a determination that the value of transmitter power is less than the threshold: mix a baseband signal with a first oscillator signal to produce a very-low intermediate frequency (VLIF) signal; mix the VLIF signal with a second oscillator signal to produce a radio frequency (RF) signal, and transmit the RF signal.

17 Claims, 5 Drawing Sheets

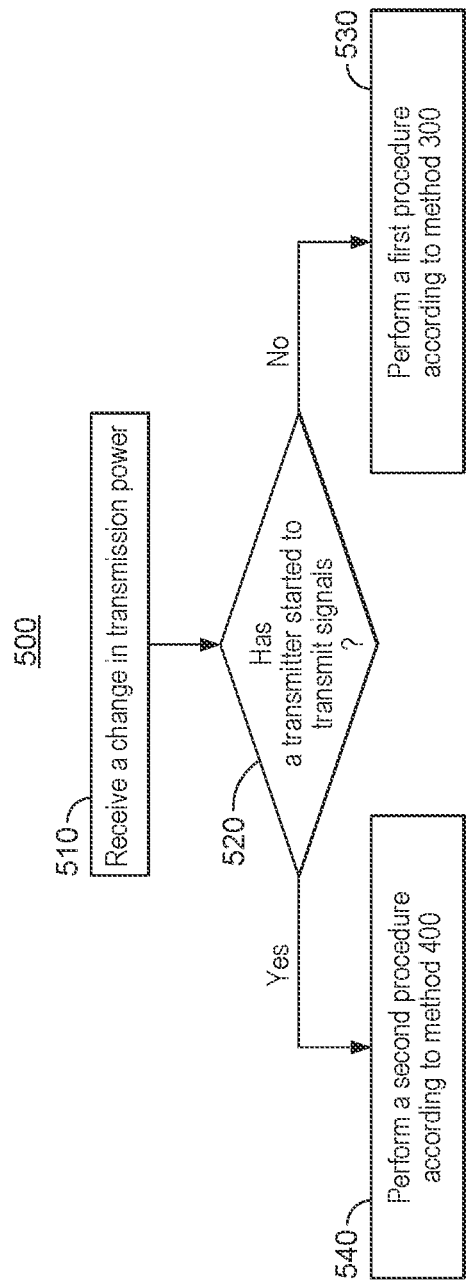

METHODS AND APPARATUS FOR TRANSMITTING SIGNALS

TECHNICAL FIELD

The present application relates to transmitters for transmitting signals, and more specifically, to methods and apparatus for transmitting signals in wireline and wireless communications.

BACKGROUND

A transmitter that transmits signals for wireline or wireless communications usually needs a mixer to modulate a baseband signal to a signal at a carrier frequency. The mixer is configured to mix the baseband signal with a local oscillator (LO) signal and output the mixed signal at the carrier frequency for transmission. However, part of the LO signal may leak into the mixer's output signal, i.e., the signal for transmission, because the transmitter may contain imperfect circuit components and/or a mismatched circuit layout. The leaked LO signal may cause undesirable effects, such as saturation of a power amplifier in the transmitter. Thus, minimizing the leaked LO signal in the signal for transmission is helpful for the transmitter to transmit signals accurately.

SUMMARY

Embodiments of the present application provide methods and apparatus for transmitting signals.

These embodiments include a transmitter for transmitting signals. The transmitter includes a memory storing instructions and a controller configured to execute the instructions to cause the transmitter to determine whether a value of transmitter power is less than a threshold, responsive to a determination that the value of transmitter power is less than the threshold: mix a baseband signal with a first oscillator signal to produce a very-low intermediate frequency (VLIF) signal, mix the VLIF signal with a second oscillator signal to produce a radio frequency (RF) signal, and transmit the RF signal.

These embodiments also include a transmitter for transmitting signals. The transmitter includes a first mixer configured to mix a baseband signal with a first oscillator signal to produce a very-low intermediate frequency (VLIF) signal. The first oscillator signal has a VLIF and the VLIF is greater than half of a channel bandwidth. The transmitter also includes an RF circuit. The RF circuit includes a second mixer. The second mixer is configured to mix the VLIF signal with a second oscillator signal to produce a radio frequency (RF) signal. The RF circuit is configured to transmit the RF signal.

These embodiments further include a method for transmitting signals. The method includes determining whether a value of transmitter power is less than a threshold, responsive to a determination that the value of transmitter power is less than the threshold: mixing a baseband signal with a first oscillator signal to produce a very-low intermediate frequency (VLIF) signal, mixing the VLIF signal with a second oscillator signal to produce a radio frequency (RF) signal, and transmitting the RF signal.

It is to be understood that the foregoing general description and the following detailed description are exemplary and explanatory only, and are not restrictive of the invention, as claimed.

BRIEF DESCRIPTION OF THE DRAWINGS

FIG. 5 illustrates an exemplary method for transmitting signals, according to some embodiments of the present disclosure.

DETAILED DESCRIPTION

Figure 1:
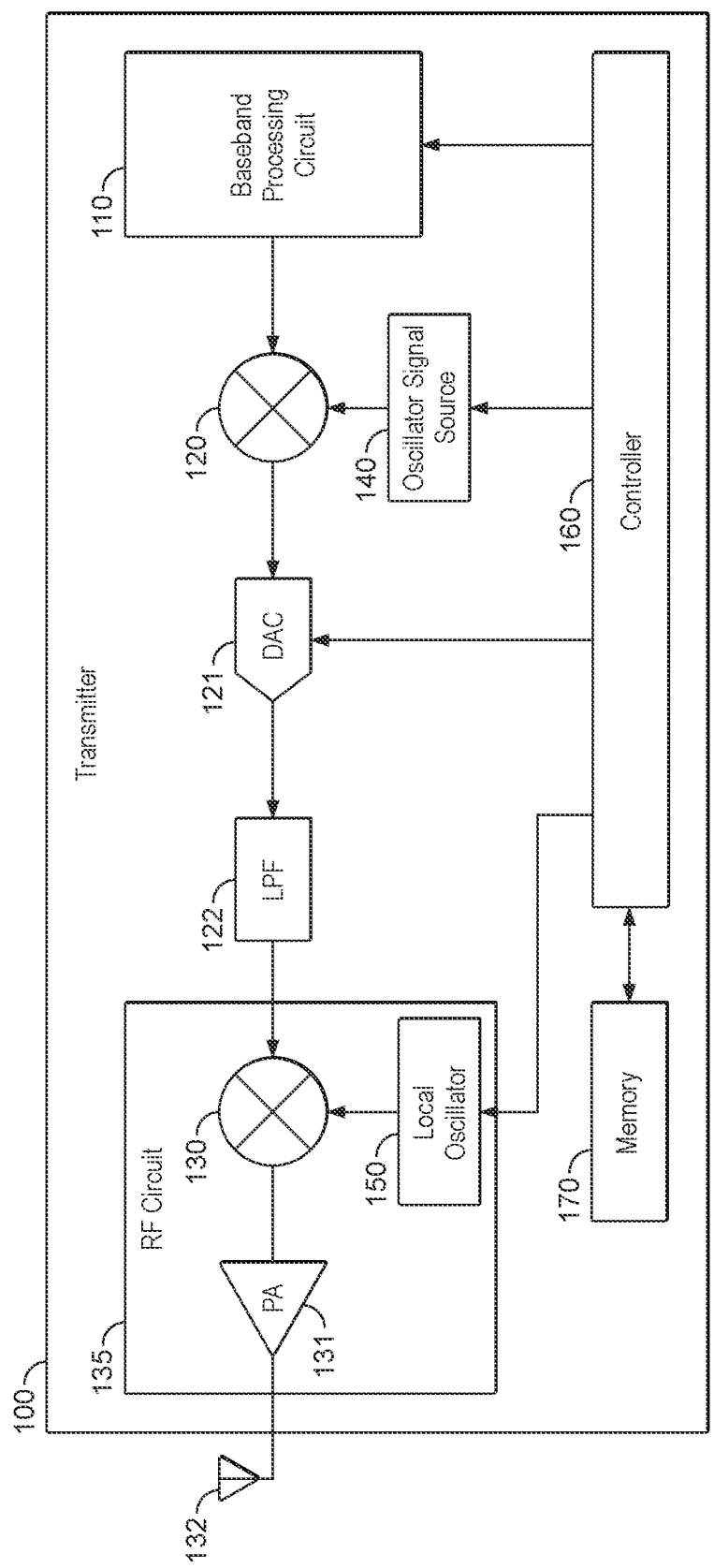
FIG. 1 illustrates an exemplary transmitter for transmitting signals, according to some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

In a wireless transmitter, baseband data is provided to a processor where it is digitally coded and modulated. The resulting digital signal is then converted to an analog signal using a digital-to-analog converter (DAC) and filtered by a low-pass filter (LPF) to reject aliases of the signal at multiples of a sampling rate of the DAC. The analog signal produced is then frequency up-converted from baseband to a radio frequency (RF) to obtain an RF modulated signal more suitable for transmission over a wireless link.

The frequency up-conversion may be performed using various transmitter architectures. For a super-heterodyne transmitter architecture, the frequency up-conversion is performed in at least two steps: typically from baseband to intermediate frequency (IF) by a first mixer, and then from IF to RF by a second mixer. However, the up-conversion can also be performed in a single step of frequency conversion, commonly called direct-conversion. In a direct-conversion transmitter architecture (also referred to as homodyne or zero-IF conversion) the baseband signal is up-converted to RF, i.e., from baseband directly to RF. Irrespective of the transmitter architecture employed, each mixer requires a local oscillator (LO) signal to perform the up-conversion from an input frequency (which is either baseband or IF) to an output frequency (which is either IF or RF).

An ideal mixer would receive an input signal at one port and an LO signal at the other port of the mixer and generate an output signal that is the input signal translated in frequency by the LO signal's frequency, $f_{LO}$. However, because of imperfections in circuit components and/or mismatch in circuit layout, some of the LO signal may leak into the mixer output signal. This "leaked" LO signal acts as noise in the output signal and may further cause other undesirable effects such as saturation of a subsequent power amplifier in the transmitter. Thus, a design consideration for a transmitter is the amount of LO leakage (also known as LO feedthrough)

in the RF modulated signal. Embodiments of the present disclosure are directed to minimizing a magnitude of LO leakage.

For a super-heterodyne transmitter, the LO signals for each of the mixers are not at the desired RF frequency and LO coupling and gain distribution in the transmitter signal path are such that LO leakage is moderate. For a direct conversion transmitter, LO leakage is problematic because the frequency of the LO signal is set to the desired RF output frequency and the LO signal can couple to the output signal. The LO leakage is unwanted energy at the LO frequency ILO that is very close to the desired output signal. As a result, it is difficult, if not impossible, to remove by filtering.

LO leakage can be especially problematic for a direct-conversion transmitter that is required to provide an output signal over a range of transmit power levels. For example, some wireless communication systems employ uplink transmitter power control that adapts output power levels of transmitted signals to ensure necessary signal quality under given channel conditions, while minimizing interference caused by the transmitter LO leakage to other users in the wireless systems and maximizing battery life of user equipment. In order to limit the interference caused by transmitter LO leakage, regulating bodies, e.g., the Federal Communications Commission (FCC), often set stringent minimum specifications for in-band emissions. Typically, in-band emission requirements are defined relative to power of transmitter output signals.

When a transmitter output signal is at a high-power level, it is not difficult for the transmitter to meet the in-band emission specifications because the amount of LO leakage relative to the output signal is normally small. However, when the power level of the transmitter output signal is reduced, it becomes difficult to satisfy the in-band emission specifications because the LO leakage becomes more significant relative to the output signal. For a direct conversion transmitter that provides a wide range of output power, LO leakage needs to be addressed to ensure that degradation of power due to LO leakage is acceptable and in-band emission specifications are met, even at a minimum output power level. Embodiments of the present disclosure are directed to methods and apparatus for mitigating LO leakage in a transmitter output signal when the transmitter transmits signals by direct conversion as well as super-heterodyne conversion.

All embodiments of the present disclosure are also applicable to wireline transmitters that contain mixers to mix signals as described herein. Wireline transmitters include, for example, transmitters for local area networks (LANs) or asymmetric digital subscriber line (ADSL) connections.

FIG. 1 illustrates an exemplary transmitter 100 for transmitting signals, according to some embodiments of the present disclosure. Transmitter 100 includes a baseband processing circuit 110, a first mixer 120, a digital-to-analog converter (DAC) 121, a low-pass filter (LPF) 122, a second mixer 130, a power amplifier (PA) 131, an antenna 132, an oscillator signal source 140, a local oscillator (LO) 150, a controller 160, and a memory 170. Mixer 130, PA 131, and LO 150 form a radio frequency (RF) circuit 135.

As shown in FIG. 1, baseband processing circuit 110, mixer 120, DAC 121, LPF 122, mixer 130, PA 131, and antenna 132 are coupled sequentially to process signals for transmission. Two input ports of mixer 120 are respectively coupled to baseband processing circuit 110 to receive baseband signals and oscillator signal source 140 to receive first oscillator signals. Mixer 120 is configured to mix the baseband signals with the first oscillator signals and output mixed signals to DAC 121. DAC 121 is configured to convert the mixed signals to analog signals and send the signals to LPF 122. LPF 122 is configured to filter the analog signals and send the filtered signals to mixer 130. Two input ports of mixer 130 are respectively coupled to LPF 122 to receive the filtered signals and LO 150 to receive second oscillator signals. Mixer 130 is configured to mix the filtered signals with the second oscillator signals and output mixed signals to PA 131. PA 131 may be configured to amplify the mixed signals and output the amplified signals to antenna 132 for transmission. Controller 160 is coupled to baseband processing circuit 110, oscillator signal source 140, DAC 121, LO 150, and memory 170, and configured to control these components for transmitting signals as described herein.

Baseband processing circuit 110 includes circuits configured to process data and/or control signals to be digital baseband signals for transmission. Such circuits may include, for example, one or more of a modulation circuit, a fast Fourier transform circuit, or a baseband filtering circuit. In some embodiments, baseband processing circuit 110 may be implemented by one or more digital signal processors, general-purpose processors, or other types of processors. The one or more processors are configured to execute instructions to implement baseband processing. In some embodiments, baseband processing circuit 110 may be implemented by the same circuit or processor that implements controller 160.

Mixer 120 includes circuits configured to mix the baseband signals with the first oscillator signals, such as a digital multiplier or a complex-valued digital multiplier. Mixer 120 outputs the mixed signals to DAC 121 for conversion from digital signals to analog signals. In some embodiments, mixer 120 may be implemented by the same circuit or processor that implements baseband processing circuit 110. For example, in such embodiments, a digital signal processor may be configured to mix the baseband signals with the first oscillator signals, while the digital signal processor is also configured to implement baseband processing operations of baseband processing circuit 110.

In some embodiments, baseband processing circuit 110 may output the baseband signals to a DAC (not shown) to be converted into analog baseband signals before being mixed with analog oscillator signals by an analog mixer (not shown). The analog mixer may be configured to mix the analog baseband signals with analog oscillator signals from an analog oscillator signal source (not shown). In such embodiments, the analog mixer may include analog circuits configured to mix the analog baseband signals with the analog oscillator signals. The analog oscillator signal source is configured to provide the analog oscillator signals to the analog mixer. After the analog mixer mixes the analog baseband signals with the analog oscillator signals, the analog mixer may output the mixed analog signals to LPF 122 and RF circuit 135 for further processing for transmission, as described herein.

Oscillator signal source 140 may include circuits configured to provide the first oscillator signals, such as a numerically controlled oscillator (NCO), a memory (e.g., memory 170) storing a plurality of digital oscillator signals, or a voltage-controlled oscillator (VCO). When mixer 120 mixes the digital baseband signals with the first oscillator signals, oscillator signal source 140 may include the NCO generating digital oscillator signals as the first oscillator signals. Alternatively, oscillator signal source 140 may include the memory storing a plurality of digital oscillator signals.

Controller 160 is configured to read the digital oscillator signals from the memory and provide the digital oscillator signals to mixer 120.

In some of the above-described embodiments in which baseband processing circuit 110 outputs digital signals to the DAC to be converted into analog baseband signals and the analog mixer mixes the analog baseband signals with analog oscillator signals, the analog oscillator signal source may include the VCO generating the analog oscillator signals.

In some embodiments, baseband processing circuit 110 may be configured to directly send the baseband signals to DAC 121 to be converted into analog baseband signals. After DAC 121 converts the baseband signals into analog baseband signals, DAC 121 may send the analog baseband signals to LPF 122 and RF circuit 135 for further processing before transmission, as described herein. In such embodiments, controller 160 may be configured to bypass the mixing operation of mixer 120 in transmitter 100. In some embodiments, controller 160 may be configured to switch between mixing the baseband signal with the first analog oscillator signals by mixer 120 and bypassing mixer 120, as described below. In such embodiments, controller 160 of transmitter 100 can switch mixer 120 on/off.

Mixer 130 may include circuits configured to mix analog signals from LPF 122 with the second oscillator signals from LO 150, such circuits including an analog multiplier or an analog mixing circuit. Mixer 130 may output mixed analog signals to PA 131. PA 131 may be configured to amplify the mixed signals and send the amplified signals to antenna 132. Transmitter 100 may be configured to transmit signals via antenna 132 after the above-described series of signal processing operations, as described herein.

LO 150 includes an oscillator circuit configured to generate the second oscillator signals. For example, LO 150 may include a VCO configured to generate analog oscillator signals as the second oscillator signals for mixer 130. Controller 160 may be configured to control LO 150 to provide the second oscillator signals at a carrier frequency or an alternative frequency, as described below.

Controller 160 may include any appropriate type of general-purpose or special-purpose microprocessor, digital signal processor, or microcontroller. In some embodiments, controller 160 may include multiple processors and/or processing cores. Controller 160 may be configured to execute instructions stored in memory 170 to cause transmitter 100 to transmit signals, as described herein.

Memory 170 may include any appropriate type of mass storage devices provided to store any type of information that controller 160 may need in order to operate as described in the present disclosure. Memory 170 may be volatile or non-volatile, magnetic, semiconductor, optical, removable, non-removable, or other type of storage device or tangible (i.e., non-transitory) computer-readable medium including, but not limited to, a read-only memory (ROM), a flash memory, a dynamic random-access memory (RAM), and a static RAM. Memory 170 may be configured to store one or more instructions for execution by controller 160 for transmitting signals, as disclosed herein. Memory 170 may be further configured to store information and data used by controller 160. For example, memory 170 may be configured to store values of transmitter power, carrier frequencies, channel bandwidths, very-low intermediate frequencies (VLIFs), digital oscillator signals, and thresholds for transmitter 100 to transmit signals. In some embodiments, memory 170 stores power thresholds L1=0 dBm, L2=−25 dBm, and L3=−12.5 dBm. In some embodiments, L3=(L1+L2)/2.

Figure 2:
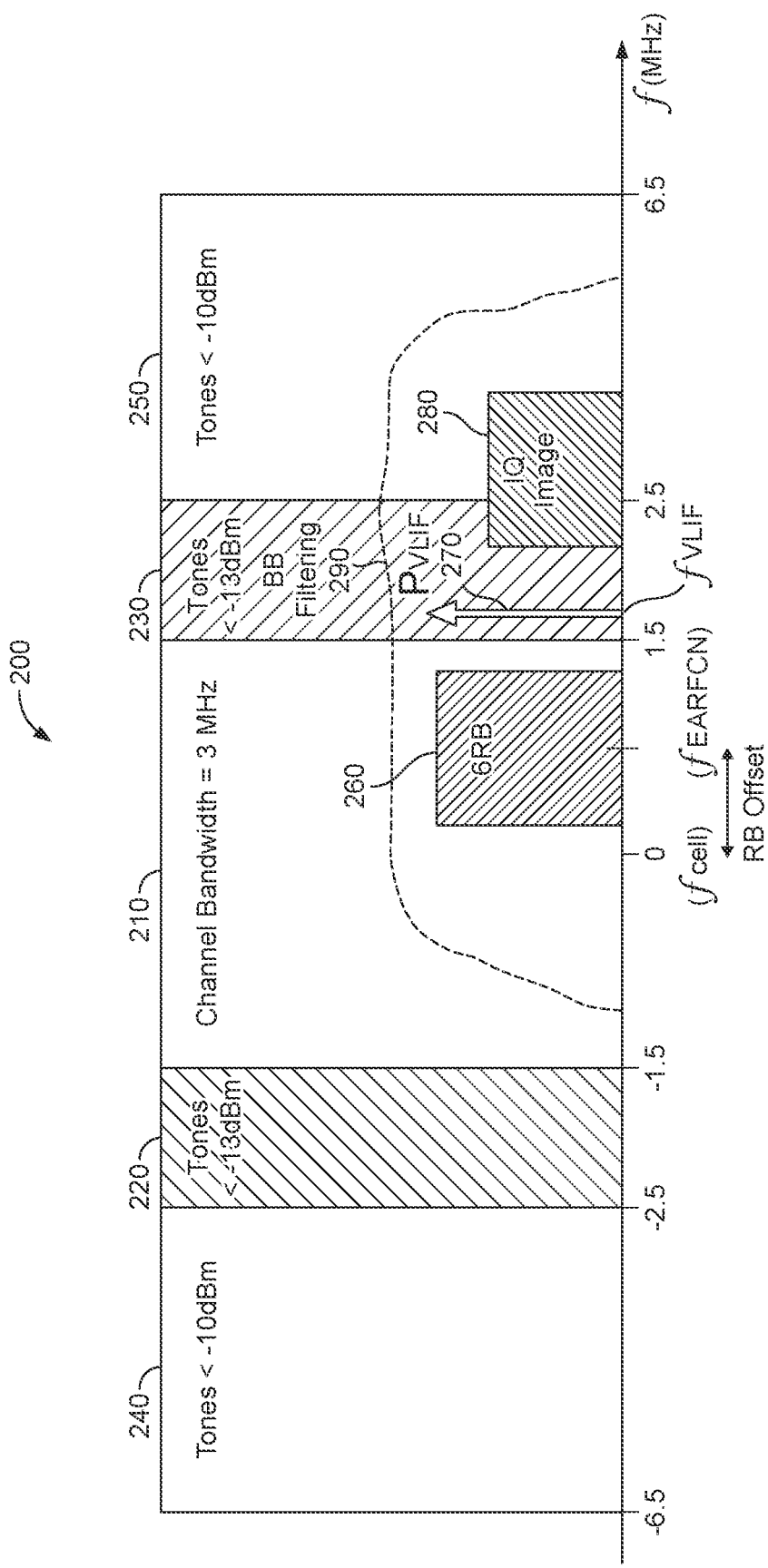
FIG. 2 illustrates exemplary transmission characteristics on an exemplary frequency band, according to some embodiments of the present disclosure.

FIG. 2 illustrates exemplary transmission characteristics 200 in an exemplary frequency band, according to some embodiments of the present disclosure. In FIG. 2, numerical values −6.5, −2.5, −1.5, 1.5, 2.5, and 6.5 on the horizontal (frequency) axis are frequency decreases or increases based on a central frequency $f_{cell}$. Power levels are on the vertical axis (not shown). Transmitter 100 is configured to transmit signals according to transmission characteristics 200. As shown in FIG. 2, transmission characteristics 200 include a channel 210 having a channel bandwidth of 3 MHz. In other words, according to transmission characteristics 200, transmitter 100 is configured to transmit signals within the 3-MHz bandwidth of channel 210. Specifically, as shown in FIG. 2, transmitter 100 is configured to transmit signals on six resource blocks (6RB) 260 within channel 210. A resource block is a smallest unit in resource allocation for transmission.

Transmission characteristics 200 also includes a first out-of-band transmission power requirement: tones <−13 dBm. As shown in FIG. 2, out-of-band (OOB) frequency bands 220 and 230 have the requirement that the power of tones is less than minus 13 dBm, i.e., tones <−13 dBm. OOB frequency bands 220 and 230 each have a bandwidth of 1 MHz. That is, when transmitter 100 transmits signals in channel 210, transmitted power of the transmitted signals on OOB frequency bands 220 and 230 is required to be below −13 dBm. The OOB transmission power requirement is intended to avoid or reduce interference in adjacent channels.

Transmission characteristics 200 further include a second OOB transmission power requirement: tones <−10 dBm. As shown in FIG. 2, OOB frequency bands 240 and 250 each have the requirement that the power of tones is less than minus 10 dBm, i.e., tones <−10 dBm. OOB frequency bands 240 and 250 each have a bandwidth of 4 MHz. That is, when transmitter 100 transmits signals in channel 210, transmitted power of the transmitted signals on OOB frequency bands 240 and 250 is required to be below −10 dBm. This OOB transmission power requirement is also intended to avoid or reduce interference in adjacent channels.

As shown in FIG. 2, channel 210 is centered at a frequency 611, which is, for example, a carrier frequency of a cell in a wireless communication system. The wireless communication system can be, for example, a long-term evolution (LTE™) system or a fifth-generation (5G) communication system. Transmitter 100 is configured to transmit signals on 6RB 260 by an RB offset. Thus, transmitter 100 transmits the signals on 6RB 260 centered at $f_{EARFCN}$, which is a frequency based on an Evolved Universal Terrestrial Radio Access (E-UTRA™) absolute radio frequency channel number. When transmitter 100 transmits the signals on 6RB 260, an in-phase and quadrature (IQ) image 280 occurs on OOB frequency bands 230 and 250. According to the OOB transmission power requirements of OOB frequency bands 230 and 250, transmitter 100 is configured to transmit the signals with a certain transmission power such that the power of IQ image 280 is below −13 dBm and −10 dBm in those respective frequency bands.

As shown in FIG. 2, a very-low intermediate frequency (VLIF) signal $P_{VLIF}$ 270 at a frequency $f_{VLIF}$ is located in OOB frequency band 230. According to transmission characteristics 200, transmitter 100 is configured to mix a baseband signal with an oscillator signal to be VLIF signal $P_{VLIF}$ 270 in OOB frequency band 230. The oscillator signal may have a VLIF, such as 1.6, 1.7, 1.8, 1.9, 2.0, 2.1, 2.2, 2.3, or 2.4 MHz. Transmitter 100 is configured to mix the baseband signal with the oscillator signal of the VLIF so that VLIF signal $P_{VLIF}$ 270 is not within channel 210. In this manner, when LO leakage occurs, the LO leakage is within OOB frequency band 230, not in channel 230. Thus, the LO leakage would not affect transmitted signals in channel 230. As a result, transmitter 100 could transmit signals in an accurate way and without degradation caused by the LO leakage.

In some embodiments, transmitter 100 may be configured to mix a baseband signal with an oscillator signal to be a VLIF signal that is not in channel 210. The VLIF signal can be in either of OOB frequency bands 230 or 250. The oscillator signal includes a VLIF, where the VLIF >1.5 MHz. The VLIF may be 1.6, 1.8, 2.0, 2.2, 3, 4, 5, or 6 MHz.

Alternatively, the VLIF signal can be in either of OOB frequency bands 220 or 240. The oscillator signal includes a VLIF, where the VLIF <−1.5 MHz. The VLIF may be −1.6, −1.8, −2.0, −2.2, −3, −4, −5, or −6 MHz. When transmitter 100 mixes a baseband signal with an oscillator signal of a negative VLIF, mixer 120 is configured to mix the baseband signal with an oscillator signal of a positive VLIF that is an absolute value of the negative VLIF. More particularly, mixer 130 is configured to mix the VLIF signal from mixer 120 with an oscillator signal from LO 150, where the oscillator signal includes an oscillator frequency $|f_{cell} - 2 \text{ VLIF}|$.

In some embodiments, transmitter 100 may also include a baseband filter (not shown). The baseband filter may be configured to filter baseband signals, as baseband (BB) filtering 290 in FIG. 2. As shown in FIG. 2, 6RB 260 and IQ image 280 are in a passband of the baseband filter, i.e., a frequency range of BB filtering 290, and therefore output to mixer 120 for further processing for transmission, as described herein.

Figure 3:
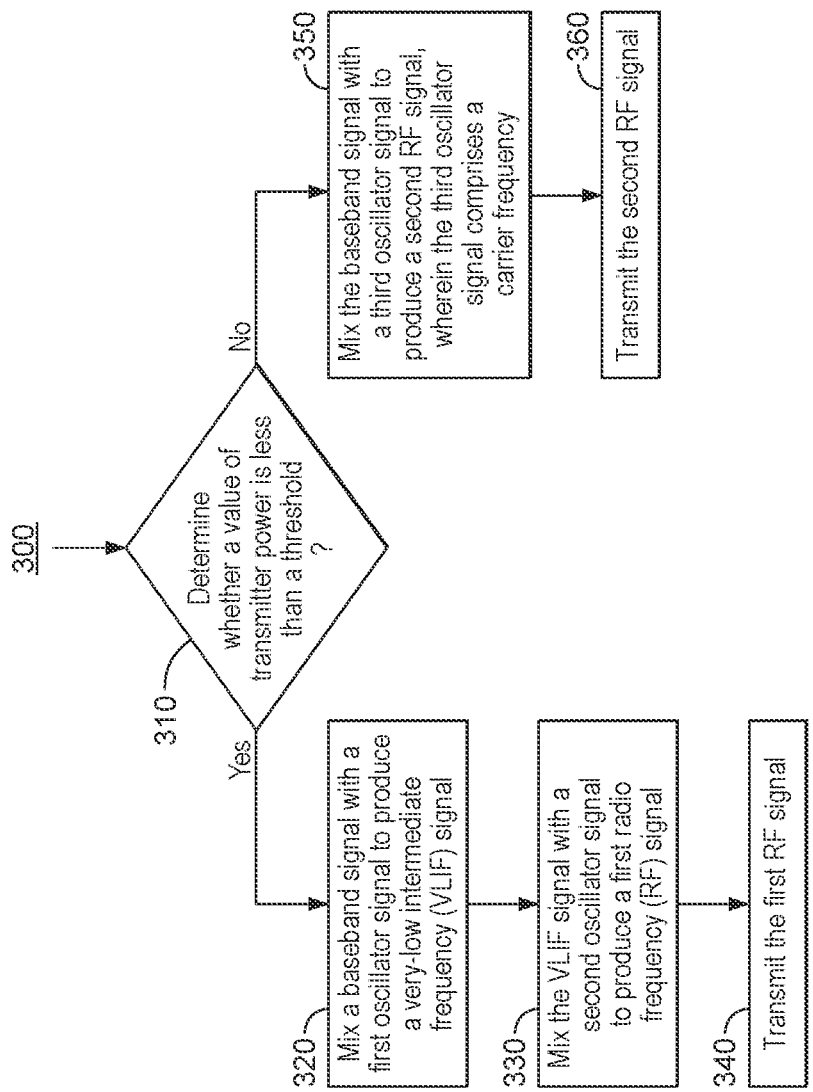
FIG. 3 illustrates an exemplary method for transmitting signals, according to some embodiments of the present disclosure.

FIG. 3 illustrates an exemplary method 300 for transmitting signals, according to some embodiments of the present disclosure. Method 300 may be practiced by transmitter 100 as disclosed herein. For example, controller 160 may be configured to execute instructions stored in memory 170 to perform operations of method 300. As another example, controller 160 may include a control circuit configured to perform the operations of method 300 according to a finite state machine. Method 300 includes determining whether a value of transmitter power is less than a threshold (step 310), mixing a baseband signal with a first oscillator signal to produce a very-low intermediate frequency (VLIF) signal in response to a determination that the value of transmitter power is less than the threshold (step 320), mixing the VLIF signal with a second oscillator signal to produce a first radio frequency (RF) signal (step 330), transmitting the first RF signal (step 340), mixing the baseband signal with a third oscillator signal to produce a second RF signal in response to a determination that the value of transmitter power is not less than the threshold (step 350), and transmitting the second RF signal (step 360). The third oscillator signal includes a carrier frequency.

Step 310 includes determining whether a value of transmitter power is less than a threshold. For example, when transmitter 100 receives, from a device controller (e.g., controller 160 or another controller not shown), a value of transmission power of −20 dBm for transmitting signals, controller 160 is configured to execute instructions stored in memory 170 to cause transmitter 100 to determine whether the value of transmitter power is less than a power threshold L3. The power threshold L3 is, for example, −12.5 dBm and stored in, for example, memory 170. Because the value of transmission power −20 dBm is less than the power threshold L3, i.e., −12.5 dBm, transmitter 100 determines that the value of transmitter power is less than the power threshold (step 310—yes). Method 300 then proceeds to step 320.

As another example, when transmitter 100 receives, from a device controller (e.g., controller 160 or another controller not shown), a value of transmission power of −5 dBm for transmitting signals, controller 160 is configured to execute the instructions stored in memory 170 to cause transmitter 100 to determine whether the value of transmitter power is less than the power threshold L3. Because the value of transmission power −5 dBm is not less than the power threshold L3, i.e., −12.5 dBm, transmitter 100 determines that the value of transmitter power is not less than the power threshold (step 310—no). Method 300 then proceeds to step 350.

Step 320 includes mixing a baseband signal with a first oscillator signal to produce a very-low intermediate frequency (VLIF) signal in response to a determination that the value of transmitter power is less than the threshold. For example, when transmitter 100 determines that the value of transmitter power of −20 dBm is less than the power threshold L3 (i.e., −12.5 dBm), controller 160 may be configured to execute the instructions stored in memory 170 to cause transmitter 100 to mix by mixer 120, a baseband signal from baseband processing circuit 110 with an oscillator signal from oscillator signal source 140 to produce a VLIF signal. Mixer 120 may output the VLIF signal to DAC 121 for further processing, as previously described with reference to FIG. 1.

Step 330 includes mixing the VLIF signal with a second oscillator signal to produce a first radio frequency (RF) signal. For example, after mixer 120 mixes the baseband signal with the oscillator signal to produce the VLIF signal in step 320, controller 160 may be configured to execute the instructions stored in memory 170 to cause transmitter 100 to mix via mixer 130, the VLIF signal with an oscillator signal from LO 150 to produce a first RF signal. Mixer 130 may output the first RF signal to PA 131 for amplification, as previously described with reference to FIG. 1.

Step 340 includes transmitting the first RF signal. For example, after mixer 130 mixes the VLIF signal with the oscillator signal from LO 150 to produce the first RF signal in step 330, controller 160 may be configured to execute the instructions stored in memory 170 to cause transmitter 100 to transmit the first RF signal via antenna 132.

Step 350 includes mixing the baseband signal with a third oscillator signal to produce a second RF signal in response to a determination that the value of transmitter power is not less than the threshold. The third oscillator signal includes a carrier frequency. For example, when transmitter 100 determines that the value of transmitter power −5 dBm is not less than the power threshold L3 (i.e., −12.5 dBm), controller 160 may be configured to execute the instructions stored in memory 170 to cause transmitter 100 to mix by mixer 130, the baseband signal with an oscillator signal from LO 150 to produce the second RF signal. The oscillator signal from LO 150 includes a carrier frequency, such as the frequency $f_{cell}$. Mixer 130 may output the second RF signal to PA 131 for amplification, as described with reference to FIG. 1.

Step 360 includes transmitting the second RF signal. For example, after mixer 130 mixes the baseband signal with the oscillator signal from LO 150 to produce the second RF signal in step 350, controller 160 may be configured to execute the instructions stored in memory 170 to cause transmitter 100 to transmit the second RF signal via antenna 132.

In some embodiments, the first oscillator signal in step 320 comprises an oscillator frequency at VLIF. The second oscillator signal in step 330 comprises an oscillator frequency equal to a carrier frequency minus the VLIF. For example, controller 160 may be configured to execute the instructions stored in memory 170 to control oscillator signal source 140 to provide an oscillator signal having a VLIF to mixer 120 as the first oscillator signal in step 320. The VLIF is, for example, 1.6 MHz. Controller 160 is also configured to control LO 150 to provide an oscillator signal to mixer 130 as the second oscillator signal in step 330 and the oscillator signal has a frequency equal to the frequency $f_{cell}$ minus the VLIF. For example, the frequency $f_{cell}$ is 2 GHz, a carrier frequency for a cell in an LTE system. The VLIF is 1.6 MHz. Accordingly, in this example, controller 160 is configured to control LO 150 to provide an oscillator signal having a frequency 1,998.4 MHz (i.e., 2 GHz minus 1.6 MHz) to mixer 130.

In some embodiments, the VLIF is greater than half of a channel bandwidth. For example, as shown in FIG. 2, channel 210 has a channel bandwidth of 3 MHz. Half of the 3-MHz channel bandwidth is 1.5 MHz. In this example, the VLIF 1.6 MHz is greater than half of the 3-MHz channel bandwidth, i.e., 1.6 MHz>1.5 MHz.

In some embodiments, the VLIF is less than the half of the channel bandwidth plus an out-of-band bandwidth. For example, as shown in FIG. 2, OOB frequency band 230 has a bandwidth of 1 MHz. In this example, the VLIF 1.6 MHz is less than half of the 3-MHz channel bandwidth plus the 1-MHz bandwidth of OOB frequency band 230, i.e., 1.6 MHz<1.5 MHz+1 MHz.

In some embodiments, the VLIF is equal to half of a channel bandwidth plus one hundred kilohertz. For example, as shown in FIG. 2, channel 210 has a channel bandwidth of 3 MHz. Half of the 3-MHz channel bandwidth is 1.5 MHz. In this example, the VLIF 1.6 MHz is equal to half of the 3-MHz channel bandwidth plus one hundred kilohertz, i.e., 1.6 MHz=1.5 MHz+100 KHz.

In some embodiments, a transmitter is configured to transmit data within a frequency band between a carrier frequency and the carrier frequency plus a VLIF. For example, as shown in FIG. 2, transmitter 100 is configured to transmit signals on 6RB 260 within a frequency band between the frequency $f_{cell}$ and the frequency $f_{cell}$ plus a VLIF, i.e., a frequency band between the frequency $f_{cell}$ and a frequency $f_{cell}$ plus $f_{VLIF}$ in FIG. 2.

In some embodiments, the VLIF signal in step 320 includes a first VLIF. The first VLIF is equal to an oscillator frequency minus a system-specific frequency. The oscillator frequency is equal to a carrier frequency plus a second VLIF. For example, after mixer 120 mixes the baseband signal with the first oscillator signal having a first VLIF to produce a VLIF signal, the VLIF signal is a signal at the first VLIF as well. A virtual target oscillator frequency is equal to the carrier frequency $f_{cell}$ plus a second VLIF (e.g., $f_{VLIF}$=1.6 MHz in FIG. 2). The first VLIF is equal to the oscillator frequency $f_{cell}+f_{VLIF}$ minus a system-specific frequency $f_{EARFCN}$. In such embodiments, transmitter 100 is configured to transmit signals on 6RB 260 based on the system-specific frequency $f_{EARFCN}$, where 6RB 260 is centered at the system-specific frequency $f_{EARFCN}$. As shown in FIG. 2, there is an RB offset from the cell frequency $f_{cell}$ to the system-specific frequency $f_{EARFCN}$. When transmitter 100 transmits signals centered at the system-specific frequency $f_{EARFCN}$, transmitter 100 mixes the baseband signal with the oscillator signal of the first VLIF (i.e., $f_{cell}+f_{VLIF}-f_{EARFCN}$) to produce the VLIF signal.

In some embodiments, a wireless transmitter may be configured to practice method 300. For example, transmitter 100 is a wireless transmitter and configured to practice method 300, as described herein.

In some embodiments, the baseband signal in step 320 includes a digital baseband signal. The first oscillator signal in step 320 includes a digital oscillator signal. Transmitter 100 is configured to mix the digital baseband signal with the digital oscillator signal to produce the VLIF signal in step 320. For example, the baseband signal output from baseband processing circuit 110 to mixer 120 is a digital baseband signal. An oscillator signal output from oscillator signal source 140 to mixer 120 is a digital oscillator signal. Controller 160 is configured to execute the instructions stored in memory 170 to cause transmitter 100 to mix the digital baseband signal output from baseband processing circuit 110 with the digital oscillator signal output from oscillator signal source 140 to produce the VLIF signal.

In some embodiments, a transmitter includes a first mixer configured to mix a baseband signal with a first oscillator signal to produce a very-low intermediate frequency (VLIF) signal. The first oscillator signal comprises a VLIF and the VLIF is greater than half of a channel bandwidth. The transmitter includes an RF circuit comprising a second mixer. The second mixer is configured to mix the VLIF signal with a second oscillator signal to produce an RF signal. The RF circuit is configured to transmit the RF signal.

For example, as described above with reference to FIGS. 1 and 2, transmitter 100 includes mixer 120 configured to mix a baseband signal output from baseband processing circuit 110 with a first oscillator signal output from oscillator signal source 140 to produce a VLIF signal. The first oscillator signal may have a VLIF of 1.6 MHz, i.e., $f_{VLIF}$. The VLIF of 1.6 MHz is greater than half of the 3-MHz channel bandwidth of channel 210, i.e., 1.6 MHz>1.5 MHz. Transmitter 100 includes RF circuit 135. RF circuit 135 includes mixer 130, PA 131, and LO 150. Mixer 130 may be configured to mix the VLIF signal with a second oscillator signal from LO 150 to produce an RF signal. RF circuit 135 may be configured to transmit the RF signal via antenna 132.

In some embodiments, the VLIF may be less than half of the channel bandwidth plus an out-of-band bandwidth. For example, as shown in FIG. 2, OOB frequency band 230 has a bandwidth of 1 MHz. The VLIF 1.6 MHz may be less than half of the 3-MHz channel bandwidth plus the 1-MHz bandwidth of OOB frequency band 230, i.e., 1.6 MHz<1.5 MHz+1 MHz.

In some embodiments, a digital mixer may be configured to mix the baseband signal with the first oscillator signal to produce the VLIF signal. For example, as described above with reference to FIG. 1, mixer 120 may comprise a digital multiplier or a complex-valued digital multiplier. Mixer 120 mixes a baseband signal output from baseband processing circuit 110 with an oscillator signal output from oscillator signal source 140 to produce an VLIF signal.

Figure 4:
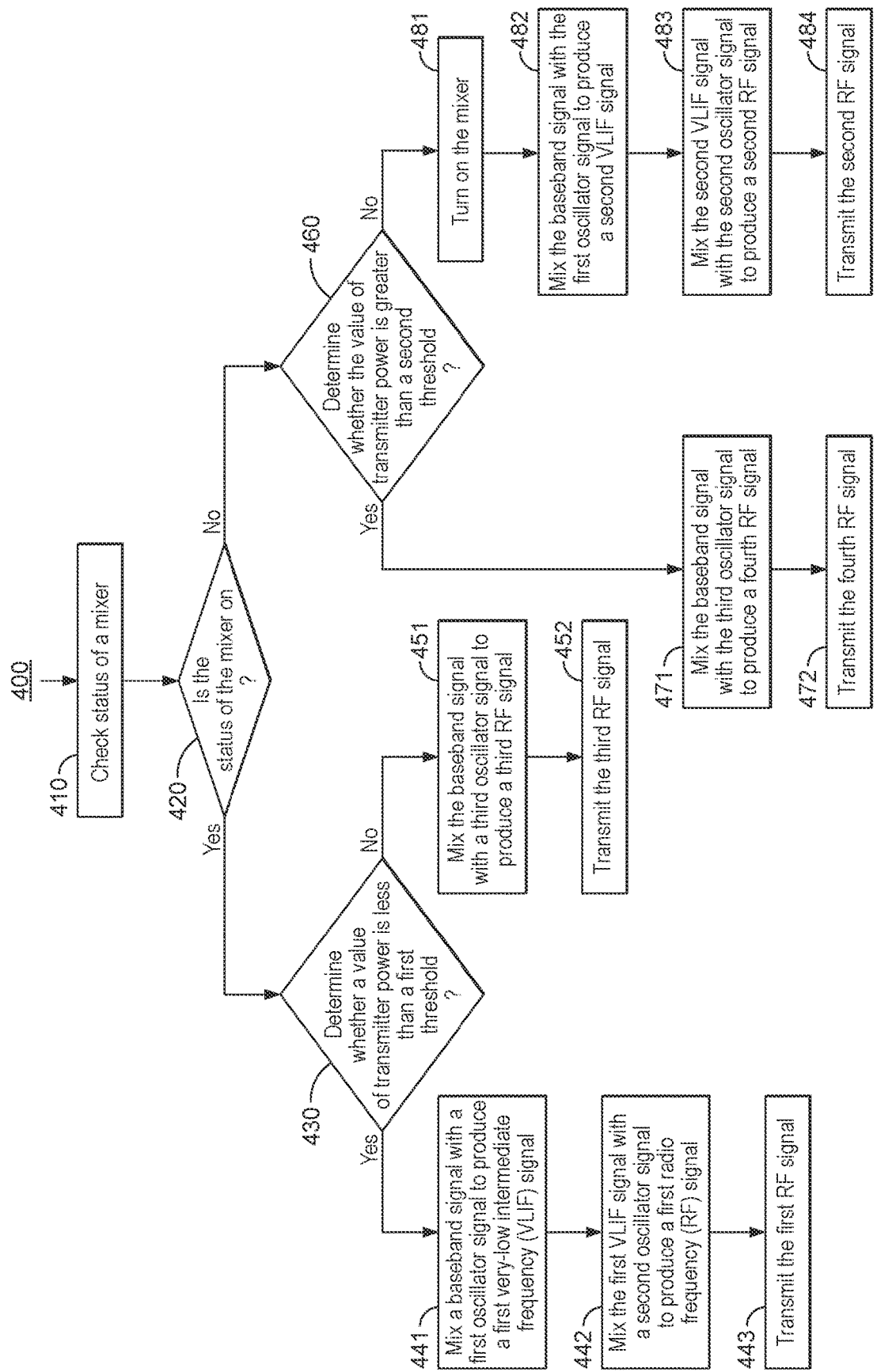
FIG. 4 illustrates an exemplary method for transmitting signals, according to some embodiments of the present disclosure.

FIG. 4 illustrates an exemplary method 400 for transmitting signals, according to some embodiments of the present disclosure. Method 400 may be practiced by transmitter 100 as disclosed herein. For example, controller 160 may be configured to execute instructions stored in memory 170 to perform operations of method 400. As another example, controller 160 may include a control circuit configured to perform the operations of method 400 according to a finite state machine.

Method 400 includes checking status of a mixer (step 410), determining whether the status of the mixer is ON (step 420), determining whether a value of transmitter power is less than a first threshold when the status of the mixer is ON (step 430), mixing a baseband signal with a first oscillator signal to produce a first very-low intermediate frequency (VLIF) signal in response to a determination that the value of transmitter power is less than the first threshold (step 441), mixing the first VLIF signal with a second oscillator signal to produce a first radio frequency (RF) signal (step 442), transmitting the first RF signal (step 443), mixing the baseband signal with a third oscillator signal to produce a third RF signal in response to a determination that the value of transmitter power is not less than the first threshold (step 451), transmitting the third RF signal (step 452), determining whether the value of transmitter power is greater than a second threshold when the status of the mixer is OFF (step 460), mixing the baseband signal with the third oscillator signal to produce a fourth RF signal in response to a determination that the value of transmitter power is greater than the second threshold (step 471), transmitting the fourth RF signal (step 472), turning on the mixer in response to a determination that the value of transmitter power is not greater than the second threshold (step 481), mixing the baseband signal with the first oscillator signal to produce a second VLIF signal (step 482), mixing the second VLIF signal with the second oscillator signal to produce a second RF signal (step 483), and transmitting the second RF signal (step 484). The third oscillator signal includes a carrier frequency.

Step 410 includes checking a status of a mixer. For example, controller 160 may be configured to execute instructions stored in memory 170 to cause transmitter 100 to check an ON/OFF status of mixer 120. The ON/OFF status of mixer 120 indicates whether transmitter 100 processes data and/or control signals for transmission via a VLIF. If the status of mixer 120 is ON, transmitter 100 processes data and/or control signals via VLIF. If the status of mixer 120 is OFF, transmitter 100 does not process data and/or control signals for transmission via VLIF.

As another example, controller 160 may be configured to execute instructions stored in memory 170 to cause transmitter 100 to check a status of mixer 130. When mixer 130 mixes signals with an oscillator signal from LO 150 that has a frequency equal to a carrier frequency (e.g., $f_{cell}$), it indicates the status of mixer 120 is OFF and transmitter 100 does not process data and/or control signals for transmission via VLIF. When mixer 130 mixes signals with an oscillator signal from LO 150 that has a frequency not equal to a carrier frequency (e.g., $f_{cell}$), it indicates the status of mixer 120 is ON and transmitter 100 processes data and/or control signals for transmission via VLIF.

Step 420 includes determining whether the status of the mixer is ON. For example, controller 160 may be configured to execute the instructions stored in memory 170 to cause transmitter 100 to determine whether the status of mixer 120 is ON. If transmitter 100 determines that the status of mixer 120 is ON (step 420—yes), method 400 proceeds to step 430 and transmitter 100 processes data and/or control signals for transmission via VLIF.

Step 430 includes determining whether a value of transmitter power is less than a first threshold when the status of the mixer is ON. For example, when transmitter 100 practices method 300 to transmit signals by a value of transmission power less than the power threshold L3, as described with reference to FIG. 3, transmitter 100 processes data and/or control signals for transmission via VLIF by mixer 120. Thus, the status of mixer 120 is ON. In such status, when transmitter 100 receives a new value of transmission power for subsequent baseband signals, transmitter 100 may be configured to determine whether to process the subsequent baseband signals for transmission via VLIF based on a power threshold L1. Specifically, controller 160 may be configured to execute the instructions stored in memory 170 to cause transmitter 100 to determine whether the new value of transmitter power is less than the power threshold L1 when the status of mixer 120 is ON. The power threshold L1 may be, for example, 0 dBm.

For example, when the status of mixer 120 is ON, transmitter 100 receives, from a device controller (e.g., controller 160 or another controller not shown), a new value of transmission power of −10 dBm for transmitting a subsequent baseband signals. The device controller is a controller of a device that may contain transmitter 100 or may provide a value of transmission power to transmitter 100. The device is in a wireless or wireline system, and the device controller may be configured to provide one or more values of transmission power to transmitter 100 based on protocols and/or requirements of the wireless or wireline system. In some embodiments, the device controller and controller 160 may be the same controller or processor. Controller 160 may be configured to execute instructions stored in memory 170 to cause transmitter 100 to determine that the new value of transmitter power −10 dBm is less than the power threshold L1, e.g., 0 dBm. As another example, when the status of mixer 120 is ON, transmitter 100 receives a new value of transmission power 0.5 dBm for transmitting subsequent baseband signals. Controller 160 may be configured to execute instructions stored in memory 170 to cause transmitter 100 to determine that the new value of transmitter power 0.5 dBm is not less than the power threshold L1, e.g., 0 dBm.

In some embodiments, the power threshold L1 may be higher than the power threshold L3. For example, the power thresholds L1 and L3 may be 0 and −12.5 dBm, respectively. In this manner, after transmitter 100 has been processing data and/or control signals for transmission via VLIF, the power threshold L1 being higher than the power threshold L3 would provide transmitter 100 a greater possibility to continue processing next data and/or control signals for transmission via VLIF. This may result in transmitter 100 avoiding frequently switching between processing data and/or control signals via VLIF and not via VLIF. It may also result in transmitter 100 avoiding frequently switching mixer 120 ON/OFF.

If at step 430 transmitter 100 determines the new value of transmitter power is less than the threshold L1 (step 430—yes), method 400 proceeds to step 441. If at step 430 transmitter 100 determines the new value of transmitter power is not less than the threshold L1 (step 430—no), method 400 proceeds to step 451.

Step 441 includes mixing a baseband signal with a first oscillator signal to produce a first very-low intermediate frequency (VLIF) signal in response to a determination that the value of transmitter power is less than the first threshold. For example, when transmitter 100 determines that the new value of transmitter power −10 dBm is less than the power threshold L1 (i.e., 0 dBm), controller 160 may be configured to execute the instructions stored in memory 170 to cause transmitter 100 to mix, by mixer 120, a subsequent baseband signal from baseband processing circuit 110 with an oscillator signal from oscillator signal source 140 to produce a first VLIF signal. Mixer 120 outputs the first VLIF signal to DAC 121 for further processing, as described with reference to FIG. 1.

Step 442 includes mixing the first VLIF signal with a second oscillator signal to produce a first radio frequency (RF) signal. For example, after transmitter 100 mixes the baseband signal with the oscillator signal to produce the first VLIF signal in step 441, controller 160 may be configured to execute the instructions stored in memory 170 to cause transmitter 100 to mix, via mixer 130, the first VLIF signal with an oscillator signal from LO 150 to produce a first RF signal. Mixer 130 outputs the first RF signal to PA 131 for amplification, as previously described with reference to FIG. 1.

Step 443 includes transmitting the first RF signal. For example, after transmitter 100 mixes the first VLIF signal with the oscillator signal from LO 150 to produce the first RF signal in step 442, controller 160 may be configured to execute the instructions stored in memory 170 to cause transmitter 100 to transmit the first RF signal via antenna 132.

Step 451 includes mixing the baseband signal with a third oscillator signal to produce a third RF signal in response to a determination that the value of transmitter power is not less than the first threshold. For example, when transmitter 100 determines that the new value of transmitter power 0.5 dBm is not less than the power threshold L1 (i.e., 0 dBm) in step 430, controller 160 may be configured to execute the instructions stored in memory 170 to cause transmitter 100 to mix a subsequent baseband signal with an oscillator signal from LO 150 by mixer 130 to produce a third RF signal. The oscillator signal from LO 150 includes a carrier frequency, such as the frequency $f_{cell}$. Mixer 130 may output the third RF signal to PA 131 for amplification, as described with reference to FIG. 1.

Step 452 includes transmitting the third RF signal. For example, after transmitter 100 mixes the baseband signal with the oscillator signal from LO 150 to produce the third RF signal in step 451, controller 160 may be configured to execute the instructions stored in memory 170 to cause transmitter 100 to transmit the third RF signal via antenna 132.

If at step 420 transmitter 100 determines that the status of mixer 120 is OFF (step 420—no), method 400 proceeds to step 460. For example, when transmitter 100 practices method 300 to transmit signals by a value of transmission power that is not less than the power threshold L3, as described above with reference to FIG. 3, transmitter 100 processes data and/or control signals for transmission not via a VLIF. Thus, the status of mixer 120 is OFF. Transmitter 100 determines that the status of mixer 120 is OFF and proceeds to step 460.

Step 460 includes determining whether the value of transmitter power is greater than a second threshold when the status of the mixer is OFF. For example, after transmitter 100 determines that the status of mixer 120 is OFF, transmitter 100 receives a new value of transmission power for a subsequent baseband signal. In such example, transmitter 100 is configured to determine whether to process the subsequent baseband signals for transmission via a VLIF based on a power threshold L2. Specifically, controller 160 may be configured to execute the instructions stored in memory 170 to cause transmitter 100 to determine whether the new value of transmitter power is greater than the power threshold L2 when the status of mixer 120 is OFF. The power threshold L2 may be, for example, −25 dBm.

For example, when the status of mixer 120 is OFF, transmitter 100 receives, from the device controller (e.g., controller 160 or another controller not shown), a new value of transmission power −10 dBm for transmitting subsequent baseband signals. Controller 160 may be configured to execute instructions stored in memory 170 to cause transmitter 100 to determine that the new value of transmitter power −10 dBm is greater than the power threshold L2 −25 dBm. As another example, when the status of mixer 120 is OFF, transmitter 100 receives, from the device controller (e.g., controller 160 or another controller not shown), a new value of transmission power −30 dBm for transmitting subsequent baseband signals. Controller 160 may be configured to execute instructions stored in memory 170 to cause transmitter 100 to determine that the new value of transmitter power −30 dBm is not greater than the power threshold L2 −25 dBm.

In some embodiments, the power threshold L2 is less than the power threshold L3. For example, the power thresholds L2 and L3 may be −25 and −12.5 dBm, respectively. In this manner, after transmitter 100 has been processing data and/or control signals for transmission not via VLIF, the lower power threshold L2 would provide transmitter 100 less possibility to change the processing of next data and/or control signals for transmission from not via VLIF to via VLIF. This may result in transmitter 100 avoiding frequently switching between processing data and/or control signals not via VLIF and via VLIF. It may also result in transmitter 100 avoiding frequently switching mixer 120 ON/OFF.

If at step 460 transmitter 100 determines that the new value of transmitter power is greater than the second threshold (step 460—yes), method 400 proceeds to step 471. If at step 460 transmitter 100 determines that the new value of transmitter power is not greater than a second threshold (step 460—no), method 400 proceeds to step 481.

Step 471 includes mixing the baseband signal with the third oscillator signal to produce a fourth RF signal in response to a determination that the value of transmitter power is greater than the second threshold. For example, when transmitter 100 determines that the new value of transmitter power of −10 dBm is greater than the power threshold L2 (e.g., −25 dBm) in step 460, controller 160 may be configured to execute the instructions stored in memory 170 to cause transmitter 100 to mix a subsequent baseband signal with an oscillator signal from LO 150 by mixer 130 to produce a fourth RF signal. The oscillator signal from LO 150 includes a carrier frequency, such as the frequency $f_{cell}$. Mixer 130 outputs the RF signal to PA 131 for amplification, as previously described with reference to FIG. 1.

Step 472 includes transmitting the fourth RF signal. For example, after transmitter 100 mixes the baseband signal with the oscillator signal from LO 150 to produce the fourth RF signal in step 471, controller 160 may be configured to execute the instructions stored in memory 170 to cause transmitter 100 to transmit the fourth RF signal via antenna 132.

Step 481 includes turning on the mixer in response to a determination that the value of transmitter power is not greater than the second threshold. For example, when transmitter 100 determines that the new value of transmitter power of −30 dBm is not greater than the power threshold L2 (e.g., −25 dBm), controller 160 may be configured to execute the instructions stored in memory 170 to cause transmitter 100 to turn on mixer 120.

Step 482 includes mixing the baseband signal with the first oscillator signal to produce a second VLIF signal. For example, after transmitter 100 turns on mixer 120 as described in step 481, controller 160 may be configured to execute the instructions stored in memory 170 to cause transmitter 100 to mix subsequent baseband signals from baseband processing circuit 110 with an oscillator signal from oscillator signal source 140 by mixer 120 to produce a second VLIF signal. Mixer 120 outputs the second VLIF signal to DAC 121 for further processing, as previously described with reference to FIG. 1.

Step 483 includes mixing the second VLIF signal with the second oscillator signal to produce a second RF signal. For example, after transmitter 100 mixes the baseband signal with the oscillator signal to produce the second VLIF signal in step 482, controller 160 may be configured to execute the instructions stored in memory 170 to cause transmitter 100 to mix the second VLIF signal with an oscillator signal from LO 150 by mixer 130 to produce a second RF signal. Mixer 130 outputs the second RF signal to PA 131 for amplification, as previously described with reference to FIG. 1.

Step 484 includes transmitting the second RF signal. For example, after transmitter 100 mixes the second VLIF signal with the second oscillator signal from LO 150 to produce the second RF signal, as described in step 483, controller 160 may be configured to execute the instructions stored in memory 170 to cause transmitter 100 to transmit the second RF signal via antenna 132.

In some embodiments, the first oscillator signal, the second oscillator signal, the third oscillator signal, the VLIF, and/or the VLIF signal in method 400 include characteristics of the first oscillator signal, the second oscillator signal, the third oscillator signal, the VLIF, and/or the VLIF signal in method 300, as described with reference to FIGS. 1-3.

FIG. 5 illustrates an exemplary method 500 for transmitting signals, according to some embodiments of the present disclosure. Method 500 may be practiced by transmitter 100 disclosed and illustrated in the present disclosure. For example, controller 160 may be configured to execute instructions stored in memory 170 to perform operations of method 500. As another example, controller 160 may include a control circuit configured to perform the operations of method 500 according to a finite state machine. Method 500 includes receiving a change in transmission power (step 510), determining whether a transmitter has started to transmit signals (step 520), performing a first procedure according to method 300 in response to a determination that the transmitter has not started to transmit signals (step 530), and performing a second procedure according to method 400 in response to a determination that the transmitter has started to transmit signals (step 540).

Step 510 includes receiving a change in transmission power from a device controller. For example, controller 160 may be configured to execute instructions stored in memory 170 to cause transmitter 100 to receive a change in transmission power from a device controller (e.g., controller 160 or another controller not shown). As another example, controller 160 may be configured to execute instructions stored in memory 170 to cause transmitter 100 to receive, from a device controller (e.g., controller 160 or another controller not shown), a value of transmission power for transmitting signals. The reception of the value of transmission power indicates a change in transmission power.

Step 520 includes determining whether the transmitter has started to transmit signals. For example, controller 160 may be configured to execute the instructions stored in memory 170 to cause transmitter 100 to determine whether transmitter 100 has started to transmit signals. When transmitter 100, for example, has just been initialized or turned on again, controller 160 may determine that transmitter 100 has not started to transmit signals. When transmitter 100 continues transmitting signals or remains in an ON state after transmitting signals, controller 160 may determine that transmitter 100 has started to transmit signals.

If at step 520 transmitter 100 determines that the transmitter has started to transmit signals (step 520—yes), method 500 proceeds to step 540. If at step 520 transmitter 100 determines that the transmitter has not started to transmit signals (step 520—no), method 500 proceeds to step 530.

Step 530 includes performing a first procedure according to method 300 in response to a determination that the transmitter has not started to transmit signals. For example, when transmitter 100 determines that transmitter 100 has not started to transmit signals as described in step 520, controller 160 may be configured to execute the instructions stored in memory 170 to cause transmitter 100 to perform a procedure according to method 300 as described with reference to FIG. 3.

Step 540 includes performing a second procedure according to method 400 in response to a determination that the transmitter has started to transmit signals. For example, when transmitter 100 determines that transmitter 100 has started to transmit signals as described in step 520, controller 160 may be configured to execute the instructions stored in memory 170 to cause transmitter 100 to perform a procedure according to method 400 as described with reference to FIG. 4.

In some embodiments, after a transmitter performs the first procedure according to method 300, the transmitter may be configured to perform the second procedure according to method 400. For example, after transmitter 100 is initialized, transmitter 100 may be configured to perform the first procedure according to method 300. Subsequently, if transmitter 100 receives a new value of transmission power, transmitter 100 may be configured to perform the second procedure according to method 400.

Another aspect of the disclosure is directed to a non-transitory processor-readable medium storing instructions which, when executed, cause one or more processors to perform the methods discussed above. The processor-readable medium may include volatile or non-volatile, magnetic, semiconductor, tape, optical, removable, non-removable, or other types of processor-readable medium or processor-readable storage devices. For example, the processor-readable medium may be the storage device or the memory module having the processor instructions stored thereon, as disclosed. In some embodiments, the processor-readable medium may be a disc or a flash drive having the processor instructions stored thereon.

It will be appreciated that the present disclosure is not limited to the exact construction that has been described above and illustrated in the accompanying drawings, and that various modifications and changes can be made without departing from the scope thereof. It is intended that the scope of the application should only be limited by the appended claims.

The present disclosure is also related to features described in the following numbered embodiments ("E"). The numbered embodiments are illustrated and described according to some embodiments of the present disclosure.

E1. A transmitter for transmitting signals, the transmitter comprising:
a controller configured to determine whether a value of transmitter power is less than a threshold;
a first mixer configured to mix a baseband signal with a first oscillator signal to produce a VLIF signal in response to a determination that the value of transmitter power is less than the threshold;
an RF circuit comprising a second mixer, wherein:
the second mixer is configured to mix the VLIF signal with a second oscillator signal to produce a radio frequency (RF) signal; and the RF circuit is configured to transmit the RF signal.

E2. The transmitter of E1, wherein:
the first oscillator signal comprises a VLIF; and
the second oscillator signal comprises an oscillator frequency,
wherein the oscillator frequency is equal to a carrier frequency minus the VLIF.

E3. The transmitter of E2, wherein the VLIF is greater than half of a channel bandwidth.

E4. The transmitter of E3, wherein the VLIF is less than the half of the channel bandwidth plus an out-of-band bandwidth.

E5. The transmitter of E2, wherein the VLIF is equal to half of a channel bandwidth plus one hundred kilohertz.

E6. The transmitter of E2, wherein the transmitter is configured to transmit data within a frequency band between the carrier frequency and the carrier frequency plus the VLIF.

E7. The transmitter of E1, wherein:
the VLIF signal comprises a VLIF;
the second oscillator signal comprises an oscillator frequency, wherein the oscillator frequency is equal to a carrier frequency plus the VLIF; and
the VLIF is equal to a system-specific frequency minus the oscillator frequency.

E8. The transmitter of E7, wherein the transmitter is configured to transmit data in accordance with the system-specific frequency.

E9. The transmitter of E1, wherein the RF signal is a first RF signal, and the controller is further configured to cause the transmitter to:
responsive to a determination that the value of transmitter power is not less than the threshold:
mix the baseband signal with the second oscillator signal to produce a second RF signal, wherein the second oscillator signal comprises a carrier frequency; and
transmit the second RF signal.

E10. The transmitter of E1, wherein the transmitter is a wireless transmitter.

E11. The transmitter of E1, wherein:
the baseband signal comprises a digital baseband signal;
the first oscillator signal comprises a digital oscillator signal; and
the controller is configured to execute the instructions to cause the transmitter to mix the digital baseband signal with the digital oscillator signal to produce the VLIF signal.

E12. A transmitter for transmitting signals, the transmitter comprising:
a memory storing instructions and a controller configured to execute the instructions to cause the transmitter to:
check status of a mixer;
when the status of the mixer is on:
determine whether a value of transmitter power is less than a first threshold;
responsive to a determination that the value of transmitter power is less than the first threshold:
mix a baseband signal with a first oscillator signal to produce a first very-low intermediate frequency (VLIF) signal;
mix the first VLIF signal with a second oscillator signal to produce a first radio frequency (RF) signal; and
transmit the first RF signal; or
when the status of the mixer is off:
determine whether the value of transmitter power is greater than a second threshold;
responsive to a determination that the value of transmitter power is not greater than the second threshold:
turn on the mixer;
mix the baseband signal with the first oscillator signal to produce a second VLIF signal;
mix the second VLIF signal with the second oscillator signal to produce a second RF signal; and
transmit the second RF signal.

E13. The transmitter of E12, wherein the controller is further configured to cause the transmitter to:
when the status of the mixer is on:
responsive to a determination that the value of transmitter power is not less than the first threshold:
mix the baseband signal with a third oscillator signal to produce a third RF signal; and
transmit the third RF signal; or
when the status of the mixer is off:
responsive to a determination that the value of transmitter power is greater than the second threshold:
mix the baseband signal with the third oscillator signal to produce a fourth RF signal; and
transmit the fourth RF signal,
wherein the third oscillator signal comprises a carrier frequency.

What is claimed is:
1. A transmitter for transmitting signals, the transmitter comprising:
a memory storing instructions and a controller configured to execute the instructions to cause the transmitter to:
determine whether a value of transmitter power is less than a threshold;
responsive to a determination that the value of transmitter power is less than the threshold:
mix a baseband signal with a first oscillator signal to produce a very-low intermediate frequency (VLIF) signal;
mix the VLIF signal with a second oscillator signal to produce a radio frequency (RF) signal; and
transmit the RF signal;
wherein:
the VLIF signal comprises a first VLIF;
an oscillator frequency is equal to a carrier frequency plus a second VLIF; and
the first VLIF is equal to the oscillator frequency minus a system-specific frequency.

2. The transmitter of claim 1, wherein the second VLIF is greater than half of a channel bandwidth.

3. The transmitter of claim 2, wherein the second VLIF is less than the half of the channel bandwidth plus an out-of-band bandwidth.

4. The transmitter of claim 1, wherein the transmitter is configured to transmit data in accordance with the system-specific frequency.

5. The transmitter of claim 1, wherein the RF signal is a first RF signal, the controller configured to cause the transmitter to:
responsive to a determination that the value of transmitter power is not less than the threshold:
mix the baseband signal with a third oscillator signal to produce a second RF signal, wherein the third oscillator signal comprises the carrier frequency; and
transmit the second RF signal.

6. The transmitter of claim 1, wherein the transmitter is a wireless transmitter.

7. The transmitter of claim 1, wherein:
the baseband signal comprises a digital baseband signal;
the first oscillator signal comprises a digital oscillator signal; and the controller is configured to execute the instructions to cause the transmitter to mix the digital baseband signal with the digital oscillator signal to produce the VLIF signal.

8. A transmitter for transmitting signals, the transmitter comprising:
   a first mixer configured to mix a baseband signal with a first oscillator signal to produce a very-low intermediate frequency (VLIF) signal, wherein the first oscillator signal comprises a VLIF and the VLIF is greater than half of a channel bandwidth and less than the half of the channel bandwidth plus an out-of-band bandwidth; and
   an RF circuit comprising a second mixer, wherein:
     the second mixer is configured to mix the VLIF signal with a second oscillator signal to produce a radio frequency (RF) signal; and
     the RF circuit is configured to transmit the RF signal.

9. The transmitter of claim 8, wherein:
the second oscillator signal comprises an oscillator frequency,
wherein the oscillator frequency is equal to a carrier frequency minus the VLIF.

10. The transmitter of claim 9, wherein the VLIF is equal to half of a channel bandwidth plus one hundred kilohertz.

11. The transmitter of claim 9, wherein the transmitter is configured to transmit data within a frequency band between the carrier frequency and the carrier frequency plus the VLIF.

12. The transmitter of claim 8, wherein the first mixer is a digital mixer.

13. A method for transmitting signals, the method comprising:
   determining whether a value of transmitter power is less than a threshold;
   responsive to a determination that the value of transmitter power is less than the threshold:
     mixing a baseband signal with a first oscillator signal to produce a very-low intermediate frequency (VLIF) signal;
     mixing the VLIF signal with a second oscillator signal to produce a first radio frequency (RF) signal; and
     transmitting the first RF signal; and
   responsive to a determination that the value of transmitter power is not less than the threshold:
     mixing the baseband signal with a third oscillator signal to produce a second RF signal, wherein the third oscillator signal comprises a carrier frequency; and
     transmitting the second RF signal.

14. The method of claim 13, wherein:
the first oscillator signal comprises a VLIF; and
the second oscillator signal comprises an oscillator frequency,
wherein the oscillator frequency is equal to the carrier frequency minus the VLIF.

15. The method of claim 14, wherein the VLIF is greater than half of a channel bandwidth.

16. The method of claim 15, wherein the VLIF is less than the half of the channel bandwidth plus an out-of-band bandwidth.

17. The method of claim 13, wherein:
the VLIF signal comprises a first VLIF;
an oscillator frequency is equal to the carrier frequency plus a second VLIF; and
the first VLIF is equal to the oscillator frequency minus a system-specific frequency.

\* \* \* \* \*